United States Patent [19]

Tanimoto et al.

[11] 4,399,372
[45] Aug. 16, 1983

[54] INTEGRATED CIRCUIT HAVING SPARE PARTS ACTIVATED BY A HIGH-TO-LOW ADJUSTABLE RESISTANCE DEVICE

[75] Inventors: Masafumi Tanimoto, Mitaka; Nobuaki Ieda, Kodaira; Masato Wada, Tachikawa, all of Japan

[73] Assignee: Nippon Telegraph and Telephone Public Corporation, Japan

[21] Appl. No.: 213,846

[22] Filed: Dec. 8, 1980

[30] Foreign Application Priority Data

Dec. 14, 1979 [JP] Japan .................................. 54/163158

[51] Int. Cl.³ ...................... H01L 27/04; H01L 29/04; H03H 5/12; H03L 3/00
[52] U.S. Cl. .................................... 307/279; 307/304; 357/51; 357/59; 365/96; 365/200; 371/8
[58] Field of Search .................. 371/8, 21; 357/13, 41, 357/51, 59; 365/96, 200; 307/465, 304, 279

[56] References Cited

U.S. PATENT DOCUMENTS

| | | | |
|---|---|---|---|
| 3,478,229 | 11/1969 | Avery | 357/41 X |
| 3,758,761 | 9/1973 | Henrion | 371/8 |
| 3,792,319 | 2/1974 | Tsang | 357/59 X |
| 4,064,493 | 12/1977 | Davis | 365/104 X |
| 4,139,786 | 2/1979 | Raymond, Jr. et al. | 357/41 X |
| 4,146,902 | 3/1979 | Tanimoto et al. | 357/6 |
| 4,210,996 | 7/1980 | Amemiya et al. | 357/80 X |

FOREIGN PATENT DOCUMENTS 2263019 12/1972 Fed. Rep. of Germany ...... 365/200

OTHER PUBLICATIONS

*Integrated Electronics: Analog and Digital Circuits and Systems*, Millman et al., 1972, McGraw-Hill, N.Y., pp. 221–225 and 559–565.

"Fusible Link Device", Ewald et al., *IBM Tech. Disc. Bull.*, vol. 19, No. 8, 1-1977, pp. 3089–3090.

*Primary Examiner*—Stanley D. Miller
*Assistant Examiner*—David R. Hudspeth
*Attorney, Agent, or Firm*—Charles W. Helzer

[57] ABSTRACT

Disclosed is a semiconductor integrated circuit device comprising a semiconductor chip including a plurality of elements constituting multi-functional circuits and a control signal generating circuit incorporated within the semiconductor chip. The control signal generating circuit includes a variable resistance element which irreversibly changes its resistivity when a voltage having a magnitude larger than a specific level, is applied. The variable resistance element is connected in series with a fixed resistor which is further connected in parallel to the output electrodes of a field effect transistor. A control signal is applied to the input terminal of the transistor when the resistance of the variable resistance element is intended to change. An output terminal connected to the connection of the serial connected elements indicates logical "1" or "0" depending on whether the variable resistance element is in the high resistivity state or low resistivity state. In the semiconductor integrated circuit, the output of the control signal generating circuit is transmitted to at least one of the multi-functional circuits, so that it is activated or left deactivated.

14 Claims, 9 Drawing Figures

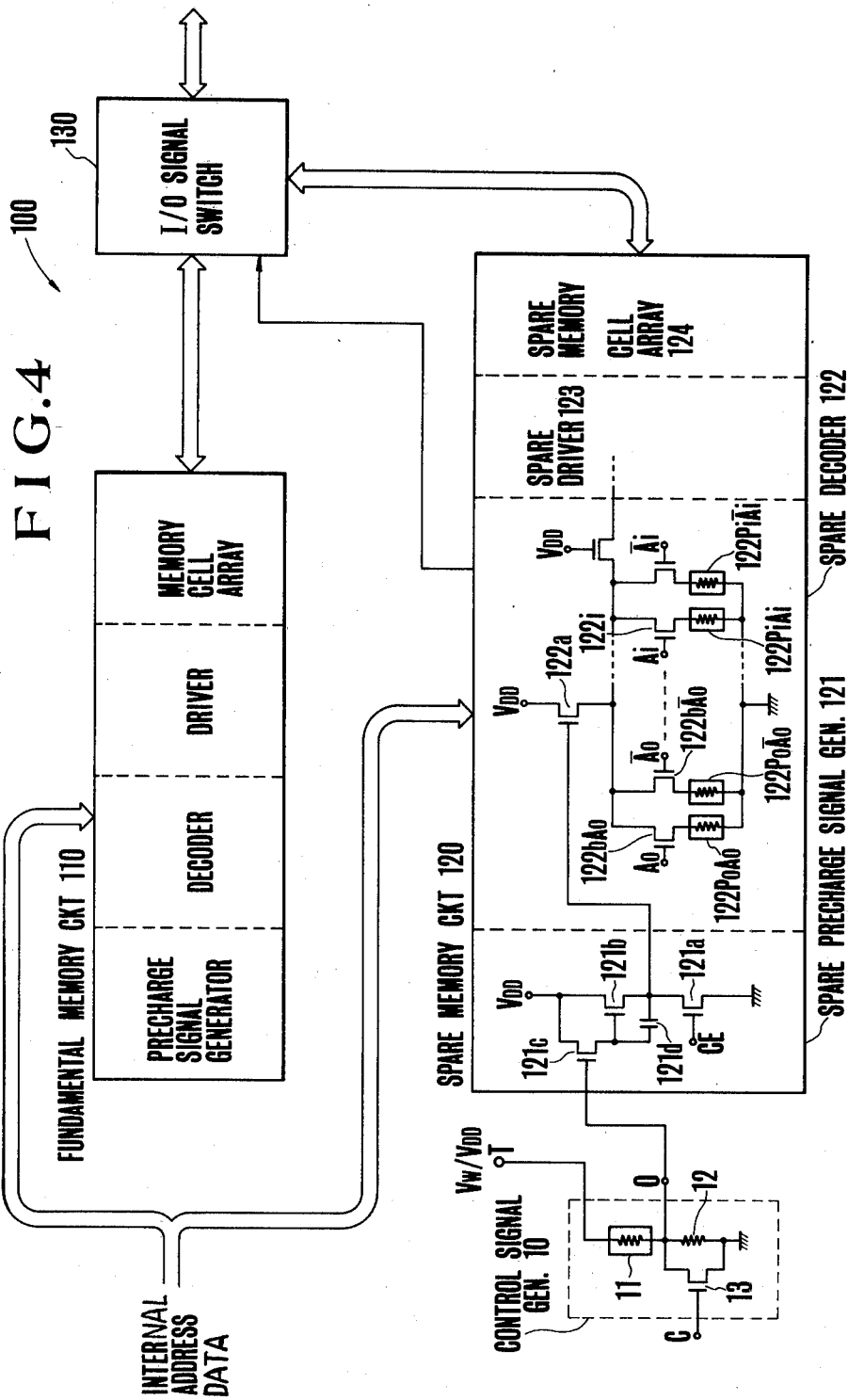

INTEGRATED CIRCUIT HAVING SPARE PARTS ACTIVATED BY A HIGH-TO-LOW ADJUSTABLE RESISTANCE DEVICE

BACKGROUND OF THE INVENTION

The present invention relates to a semiconductor integrated circuit device having control signal generating circuits.

Owing to the advanced integrated circuit technology, the number of functions implemented with an integrated circuit chip is increasing. In many cases, part of the functions performed by a chip need to be always active and others are required to be active only when they are called upon. However, power is always supplied to all parts of conventional semiconductor integrated circuit devices of this nature.

One example of such semiconductor integrated circuit devices is a random access memory having the fault tolerant function, and it is provided with spare memory circuits in addition to primary memory circuits within a chip. When a faulty bit is in the primary memory circuit, the faulty bit portion is replaced with one from a spare memory circuit, so that the number of useful bits in the memory are not reduced. On the other hand, when there is no faulty bit in primary memory circuits, it is sufficient to operate only the primary memory circuit. However, extra power is wasted in order to keep the spare memory circuit active in conventional devices of this nature. One example of such arrangement is disclosed in an article entitled "A 1 Mb Full Wafer MOS RAM", by Y. Egawa, ISSCC Digest of Technical Papers, Feb. 14, 1979, pages 18–19.

In order to obviate the probem of wasted power as noted above, it has been proposed to interrupt the power line of a spare memory circuit by burning with a laser when it is not necessary to use the spare circuit. Such technology is disclosed in an article entitled "Fault Tolerant 92160 Bit Multiphase CCD Memory", by B. R. Elmer et al., ISSCC Digest of Technical Papers, Feb. 17, 1977, pages 116–117. In this method, however, the laser beam for burning the power line of a spare memory circuit adversely may affect other components included in the same chip, resulting in poor reliability of the device. Moreover, burning the power line by use of a laser needs a special work shop, skilled manpower and considerable time, making difficult real time final inspection of chips and thus limiting the speed of manufacturing. Furthermore, this method involves other problems. For example, the spare memory circuit cannot be activated after the chip has been sealed in a package. Further, the process needs laser burning equipment which ordinarily is not used in LSI circuit testing.

SUMMARY OF THE INVENTION

It is, therefore, a primary object of the present invention to provide an integrated circuit device having a control signal generating circuit which generates control signals for activating or deactivating selected elements within the device through a relatively simple electrical process.

Another object of the present invention is to provide an integrated circuit device having a control signal generating circuit which can generate and selectively apply a control signal to selected elements within the device without adversely affecting the reliability and performance of the device.

A further object of the present invention is to provide an integrated circuit device having a control signal generating circuit, wherein selected spare components and necessary primary components can be activated during the test process, thereby enhancing the capability of the sophisticated device function and reducing operating power consumption.

A still further object of the present invention is to provide an integrated circuit device having a signal generating circuit, wherein spare components for necessary primary components can be activated after the device has been fabricated and sealed closed, thereby enhancing the reliability and capability of the device while reducing operating power consumption.

Yet another object of the present invention is to provide an integrated circuit device, wherein multi-functional circuits integrated within the chip are activated by employment of the novel and improved control signal generating circuit, so that the reliability of the device is ensured.

In order to achieve the above-mentioned objects, a variable resistance element whose resistance varies in an irreversible fashion by application of a voltage and current which is larger than a predetermined value is used.

According to one aspect of the present invention, there is provided an integrated circuit device having a control signal generating circuit comprising a variable resistance element whose resistance varies in an irreversible fashion from a high resistance value to a low resistance value by application of a signal having an amplitude larger than a predetermined value, a fixed impedance element connected in series with the variable resistance element, an active semiconductor device connected in parallel with the fixed impedance element with its ON state and OFF state controlled by an external control signal. An output terminal is provided which is adapted to transmit a signal obtained from the juncture or connection of the variable resistance element and the fixed impedance element when the power voltage is applied to these serially connected elements, the output terminal indicating logical "1" or "0" depending on whether or not the variable resistance element has made an irreversible change in its resistance.

BRIEF DESCRIPTION OF THE DRAWING

FIG. 4 is a block schematic diagram showing the control signal generating circuit of FIG. 1 incorporated in an IC random access memory;

DETAILED DESCRIPTION OF THE PREFERRED EMBODIMENT

Figure 1:
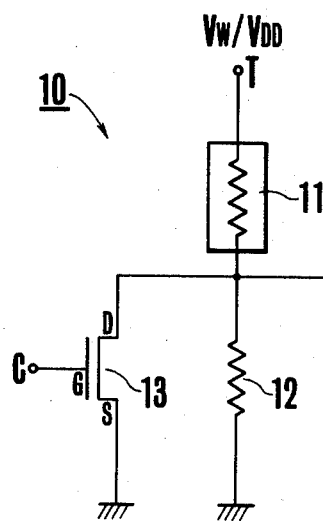
FIG. 1 is a circuit diagram of an embodiment of the control signal generating circuit for inclusion in an integrated circuit device according to the present invention.
Figure 2:
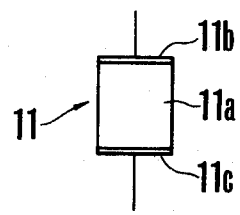
FIG. 2 is a structural physical view of a variable resistance element shown schematically in FIG. 1.

FIG. 1 shows an embodiment of the control signal generating circuit for use with integrated circuit devices in accordance with the present invention. The control signal generating circuit 10 is basically made up of a variable resistance element 11, a fixed impedance element 12 and an active semiconductor device 13. The variable resistance element 11 and fixed impedance element 12 are connected in series with their ends connected between the power supply terminal and ground. The active semiconductor device 13 is a three-terminal device, having a control terminal connected to the write control terminal C and two output terminals D and S connected across the fixed impedance element 12. The juncture or connection of variable resistance element 11 and fixed impedance element 12 is connected to the control signal output terminal O. The variable resistance element used here is of a polycrystalline silicon resistor, for example, with its resistivity varying from an initial high resistance (e.g. about $10^7$ ohms) to a low resistance (e.g. $10^3$ ohms) in an irreversible fashion when a voltage in excess of a threshold value $V_{TH}$ and a current is applied. Such variable resistance element typically comprises of a high resistivity polycrystalline silicon resistor 11a having terminal electrodes 11b and 11c made of metal or conductive semiconductor, for example, as shown in FIG. 2. The high resistivity polycrystalline silicon resistor has a resistivity of $10^7$ ohm-cm or more, for example. The impurity dopant of the resistor may be of P-type or N-type, having an extremely low doped impurity concentration. The thickness of the resistor is 0.6 microns and the area of each electrode is 3600 square microns, for example.

Figure 3:
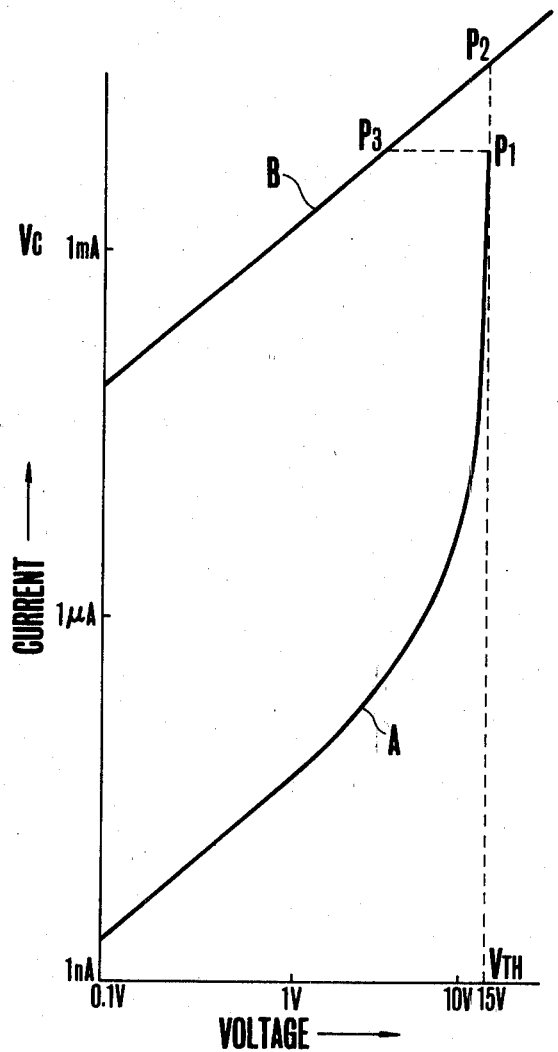
FIG. 3 is a graph showing the current-voltage characteristics of the variable resistance element shown in FIG. 1 and FIG. 2.

FIG. 3 shows the current-voltage characteristics of the variable resistance element 11 having the above-mentioned structure, where the abscissa represents the voltage and the ordinate represents the current. It can be seen from the graph that when the supplied voltage increases gradually from an initial level of about 0.1 volt, the current flowing through the variable resistance element also increases somewhat linearly in proportion to the voltage in the low voltage region. However, when the voltage exceeds a certain level, about 3 V for example, the current increases sharply (in non-linear fashion). When the voltage further increases to $V_{TH}$ of about 15 V, the current value jumps from point P1 on characteristic curve A to point P2 on characteristic curve B due to a sharp reduction of the resistivity of the variable resistance element 11. Thereafter, if the voltage increases continuously, the current increases linearly following the characteristic curve B.

Conversely, when the voltage decreases gradually from a high level, the current also decreases following the characteristic curve B, and the current does not follow the characteristic curve A after it has once passed the point P2, but decreases in proportion to the voltage, following the characteristic curve B. After that, when the applied voltage is increased again, the current merely increases following the characteristic curve B.

The above-mentioned variable resistance element, which was invented by the same inventors, is disclosed in detail in U.S. Pat. No. 4,146,902 (patented on Mar. 27, 1979). The variable resistance element used in the present invention is of course not limited to one mentioned above, but any variable resistance element processing an irreversible resistance variation and having a high-state to low-state resistance ratio of more than $10^2$, for example, can be used. For example, the polycrystalline silicon resistor 11a may be replaced with a Ni-Cr fuse, Al fuse or the PN junction. The initial resistance in the cases of Ni-Cr fuse and Al fuse is substantially zero, whereas that in the case of the PN junction is larger than a polycrystalline silicon resistor. The resistance after write operation becomes infinity in the cases of the Ni-Cr fuse and Al fuse, and it is less than 1 kilo-ohms in the case of the PN junction.

The fixed impedance element 12 is a fixed resistor having a resistance of about 100 kilo-ohms when the above-mentioned high resistivity polycrystalline silicon resistor having a low resistance $R_L$ of lower than 1 kilo-ohms and a high resistance $R_H$ of higher than 10 meg-ohms is used.

The active semiconductor device 13 is a field effect transistor with its drain electrode D connected to the juncture of the terminal electrode of variable resistance element 11 and fixed resistor 12, with its source electrode S being grounded, and with its gate electrode G connected to the control terminal C.

The operation of the control signal generating circuit 10 will now be explained as follows.

First, in the initial operation mode, the ground potential is given to the write control terminal C, so that field effect transistor 13 is cut off. Voltage Vc appearing at the control signal output terminal O is determined by the resistance ratio of variable resistance element 11 and fixed resistor 12.

By choosing resistance Ro of fixed resistor 12 so as to meet the following relationship:

$$R_L << R_o << R_H$$

where $R_H$ and $R_L$ are the resistance values of variable resistance element 11 in its high and low resistivity states, respectively, and since the initial state of variable resistance element 11 is always in the high resistivity state, voltage Vc appearing at the output terminal O in the initial operating mode can be expressed in equation (1).

$$Vc = \frac{Ro}{R_H + Ro} V_{DD} \simeq \frac{Ro}{R_H} V_{DD} \simeq 0 \tag{1}$$

In this case, the control input of transistor 13 may be left floating, or it is preferably grounded.

Next, the write mode operation of control signal generating circuit 10 is as follows. In write mode, a high level write control signal is applied to the control terminal C, and transistor 13 turns on. In this case, power supply terminal T is provided with a voltage $V_W$ which is higher than the ordinary power voltage $V_{DD}$. When transistor 13 becomes conductive, the bottom terminal of variable resistance element 11 goes to the ground level and, consequently, the power voltage $V_W$ is fully applied to variable resistance element 11. Since the voltage applied to variable resistance element 11 is higher than the threshold voltage $V_{TH}$ for the irreversible transition, the resistance of the element 11 is switched from high value to low value. In the normal mode after writing, control signal generating circuit 10 operates as follows. The write control terminal C of transistor 13 is given the ground level and the power supply terminal T is given voltage $V_{DD}$. Consequently, the output terminal O provides a voltage Vc which is determined by the ratio of the resistance of variable resistance element 11 in accordance with the characteristic curve B and the resistance of fixed resistor 12. The voltage Vc is expressed in equation (2).

$$Vc = \frac{Ro}{R_L + Ro} V_{DD} \simeq \frac{Ro}{Ro} V_{DD} = V_{DD} \quad (2)$$

It can be seen from equations (1) and (2) that the output voltage level Vc at the control signal output terminal O can be changed permanently from the low level (i.e. approx. 0 volt) to the high level (i.e. approx. $V_{DD}$) by changing the resistance of variable resistance element 11 from the high resistance $R_H$ to the low resistance $R_L$.

FIG. 4 shows the control signal generating circuit 10 of this invention applied to an IC random access memory having spare memory circuits. In the figure, circuit portions related to the present invention are shown in detail and remaining well-known portions are shown schematically.

The random access memory 100 includes primary memory circuit 110, spare memory circuit 120 and I/O signal switching circuits 130. The primary memory circuit 110 and spare memory circuit 120 each include a precharge signal generator, decoder, driver, and memory cell array.

The output of control signal generating circuit 10 characterized by this invention is supplied to spare precharge signal generating circuit 121 for spare memory circuit 120. The spare precharge signal generating circuit 121 includes a field effect transistor 121a which receives the main clock signal CE and a field effect transistor 121b connected in series with the transistor 121a and adapted to function as an inverter, with the serial connected transistors being connected across power supply $V_{DD}$ and ground. The signal generating circuit 121 further includes a third field effect transistor 121c having its output electrodes connected to the input electrode of the second transistor 121b and to power supply $V_{DD}$, respectively, and a capacitor 121d is connected between the input electrode of the second transistor 121b and the junction of the serially connected first and second transistors 121a and 121b.

With the output of control signal generating circuit 10 at "0" in the initial state of variable resistance element 11, the third transistor 121c is cut off so as to keep the spare precharge signal generating circuit 121 in the non-active state. Accordingly, when the low level of the clock pulse CE is applied to the first transistor 121a, the output of signal generating circuit 121 stays floating. Hence, the power supplying transistor 122a of decoder 122 in the next stage is kept cut off. When the level of the clock pulse CE is supplied to the first transistor 121a in this state, the output of spare precharge signal generating circuit 121a becomes substantially zero volt, and transistor 122a in the decoder is maintained in the cut off state. Therefore, spare memory circuit 120 is kept in the non-active state and does not draw power from the power source for the IC device.

Next, when the output of control signal generating circuit 10 becomes high or "1" after variable resistance element 11 changes into the low resistivity state, the spare precharge signal generating circuit 121 operates as follows.

First, with the output from control signal generator 10 at terminal O high and the clock pulse CE at high level, the first transistor 121a turns on, causing the output of the signal generating circuit 121 to become substantially zero volt. At this time, capacitor 121d is charged through the third transistor 121c which is in the on condition. In this state, transistor 122a of decoder 122 still remains in off-state. Subsequently, when the clock pulse CE is at low level, the first transistor 121a turns off, and the output voltage of signal generating circuit 10 increases gradually. Following the increase of the output voltage of signal generating circuit 10, the input voltage of the second transistor 121b also increases gradually, and it finally reaches a voltage higher than the power voltage. Consequently, signal generating circuit 10 supplies the output voltage at substantially $V_{DD}$ to transistor 122a of decoder 122, and then it turns on.

As can be seen from the above explanation, when the output of control signal generating circuit 10 is at high (i.e. "1"), precharge signal generating circuit 121 produces an output depending on the level of the clock pulse CE which is supplied to transistor 121a as well as to remaining circuit portions.

The above-mentioned arrangement for activating a spare memory in an IC device through a simple electrical process does not adversely affect other components in the activation process, as has been done in the conventional power line burning method by use of a laser, thus ensuring that the reliability of the device will not be impaired by the activation process.

The arrangement of decoder 122 will further be described in the following. One terminal of the transistor 122a is connected to power supply $V_{DD}$ and the other terminal to ground through a plurality of parallel-coupled circuit portions each consisting of a field effect transistor and a variable resistance element connected in series. For example, a serial-coupled circuit portion comprises transistor $122bA_O$ and variable resistance element $122p_OA_O$. Internal address data $A_O$ is applied to the control terminal of transistor $122bA_O$. Variable resistance elements $122p_OA_O$–$122p_iA_i$ used in the decoder have the same characteristics as that of the variable resistance element used in control signal generating circuit 10.

The address corresponding to a faulty bit is memorized in the spare decoder by way of changing the resistance of a variable resistance element. For example, in order to memorize an address $A_O$="1", the resistance of variable resistance element $122p_O\overline{A}_O$ corresponding to internal address data $\overline{A}_O$ is changed. Such spare decoder is disclosed in an article entitled "A High Performance 256K RAM Fabricated with Molydenum-Polysilicon Technology", by Mano, ISSCC Digest of Technical Papers, Feb. 15, 1980, pages 234–235.

The operation of the random access memory having the aforementioned structure will now be explained.

First, when only the primary memory circuit 110 is to be operated, control signal generating circuit 10 is kept in the initial state. The output of control signal generating circuit 10 is at low level and transistor 121c in spare memory circuit 120 is kept cut off. Thus, spare memory circuit 120 is kept in a non-active state. In such arrangement, control signal generating circuit 10 stores its output state as nonvolatile information in the variable resistance element, so that the memory which behaves identically to that without having spare circuits is available for the user. This is for those devices where no faulty bit was detected in the main memory circuit in the final testing of the IC chip when manufacturing the random access memory. In such cases, the spare memory circuit does not consume power, and the total power consumption of the memory can be kept small.

On the other hand, when a defect or faulty bit in the main or primary memory circuit 110 is detected in the final testing of the IC chip and satisfactory operation as a random access memory cannot be achieved without use of the spare memory circuit 120, spare memory circuit 120 is activated. For this purpose, when a write control signal is applied to the control terminal C of control signal generating circuit 10 shown in FIG. 1, a writing voltage $V_W$ is supplied to the power supply terminal T. Through this process, variable resistance element 11 changes from a high resistance element to a low resistance element, and control signal generating circuit 10 produces the high level output voltage at output terminal O, activating spare memory circuit 120.

It can be seen that the aforementioned arrangement only needs the application of certain voltages to the control terminal C and power supply terminal T, eliminating special facilities and processes for burning the power terminal connection as in the case of the conventional systems using a laser. The control signal can be generated by a relatively simple electrical process.

Figure 5A:
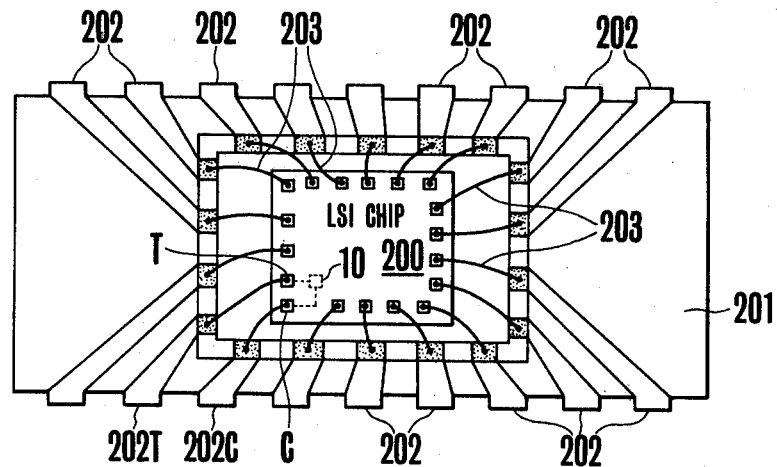
FIGS. 5A and 5B are plan views of dual-in-line packages in which the random access memory of FIG. 4 is incorporated.

FIG. 5A shows an LSI chip 200 of the random access memory shown schematically in FIG. 4 mounted in a dual-in-line package. The figure shows a ceramic substrate 201, leads 202, and conductive wires 203 made of gold, for example, for connecting pads on the LSI chip with respective leads. The LSI chip 200 only identifies the portion of control signal generating circuit 10, but it should be understood that other components shown in FIG. 4 are also included in the LSI chip 200. It should be noted that the control terminal C and power supply terminal T of control signal generating circuit 10 are located at one edge of the rectangular semiconductor chip 200 such that they are in alignment with other terminals. The control terminal C is connected by a wire 203 to lead 202C, and the power supply terminal T is connected by a wire 203 to another terminal 202T. In this arrangement, after semiconductor chip 200 on the substrate 201 has been sealed, in other words, after the device has been assembled, these terminals can be accessed from the outside for application of the signal and voltage so as to activate the spare memory circuit.

Figure 6:
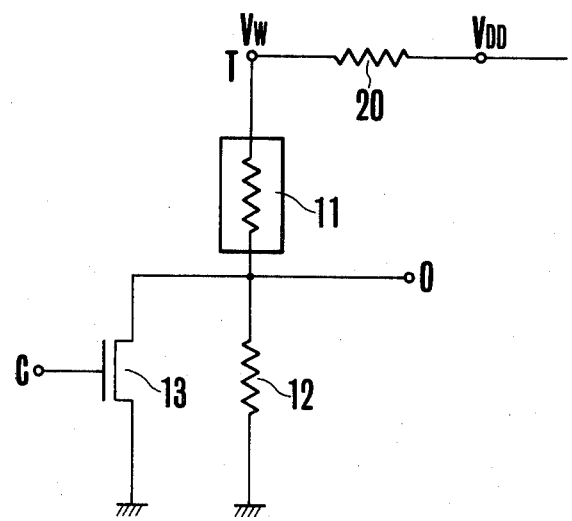
FIGS. 6 through 8 are circuit diagrams showing variations of the control signal generating circuit shown in FIG. 1 and applicable to integrated circuit devices according to the present invention.

FIG. 6 shows a variation of the control signal generating circuit in which the power supply terminal T does not need to be connected with an external lead. In this example, the power supply terminal T is connected to the common bias power supply $V_{DD}$ through a pure resistor 20, and the remaining portions are the same as those shown in FIG. 1. In this arrangement, writing power voltage $V_W$ is applied to the power supply terminal T for generating the control signal, and power voltage $V_{DD}$ is supplied through a fixed resistor 20 in the ordinary state. When writing voltage $V_W$ is applied to the power supply terminal T with the resistance of fixed resistor 20 assumed to be R', the current flowing from the writing power supply terminal T to the terminal of $V_{DD}$ is limited to $(V_W-V_{DD})/R'$ so as to prevent an excessive current. In this arrangement, the voltage level at the control signal output terminal O when variable resistance element 11 is at high resistivity state can be expressed as:

$$V_c = \frac{R_o}{R_H + R' + R_o} V_{DD}$$

where Ro denotes the resistance of fixed resistor 12, and $R_H$ denotes the higher resistance of variable resistance element 11, and when variable resistance element 11 is at low resistivity state, it can be expressed as:

$$V_c = \frac{R_o}{R_L + R' + R_o} V_{DD}$$

where $R_L$ denotes the lower resistance of variable resistance element 11.

In order that Vc is substantially zero volt when variable resistance element 11 is at high resistivity state and Vc is substantially equal to $V_{DD}$ at low resistivity state, values of Ro and R' must be chosen so as to satisfy:

$$R_H >> R_o >> R' >> R_L$$

The voltage level at the control signal output terminal O can be set permanently to the higher level (i.e. approx. $V_{DD}$) or the lower level (i.e. approx. 0 volt). In this circuit configuration, the power supply terminal T for the control signal generating circuit does not need to be bonded directly on the lead, and a package pin can be saved.

Figure 7:
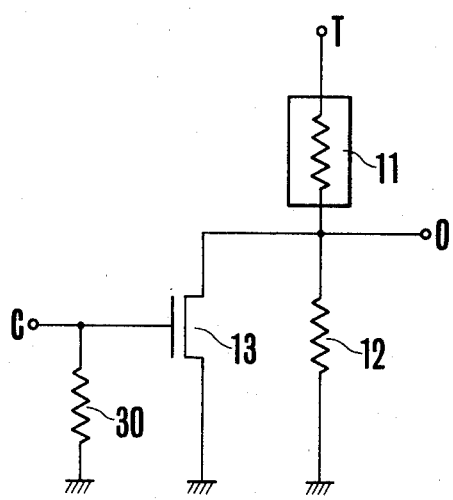

FIG. 7 shows another variation of the control signal generating circuit in accordance with the present invention, wherein a fixed resistor 30 is connected between the control terminal C of active semiconductor device 13 and ground. In this arrangement, the control terminal C of the device 13 is grounded even when it is left open. The fixed resistor 30 must have a relatively high resistance so that an excessive current does not flow in it when the write signal is applied to the write control terminal C. Also in this circuit configuration, the write control terminal does not need to be bonded, and a package pin can be saved.

Figure 5B:
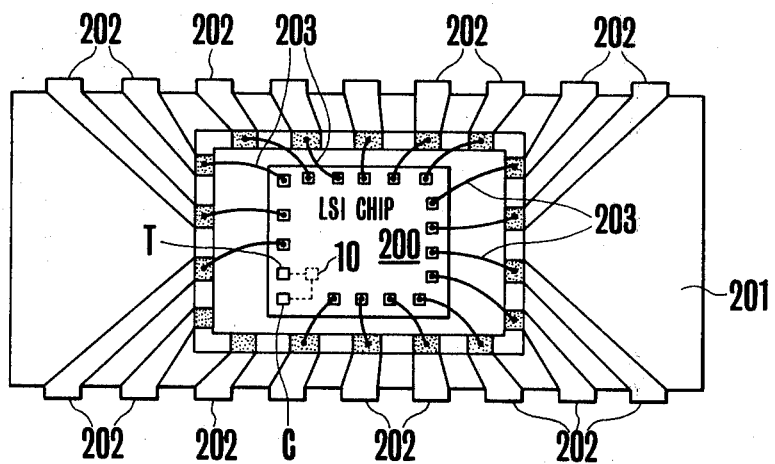

However, most of defects and troubles of the fundamental memory circuit are generated during the fabrication process. Therefore, it is necessary to activate the spare memory circuit when a defect is detected in testing immediately before assembly of the chip. When activation is necessary in this stage, the write control signal is directly applied to the control terminal pad C and LSI chip 200 and the writing voltage $V_W$ is applied to the power supply terminal T through lead 202T. Accordingly, by combination of the circuit configurations of FIGS. 6 and 7, the control terminal C and power supply terminal T as shown in FIG. 5B do not need to be connected to respective external leads. Therefore, such special-purpose leads can be eliminated, and the number of lead terminals can be standardized.

Figure 8:
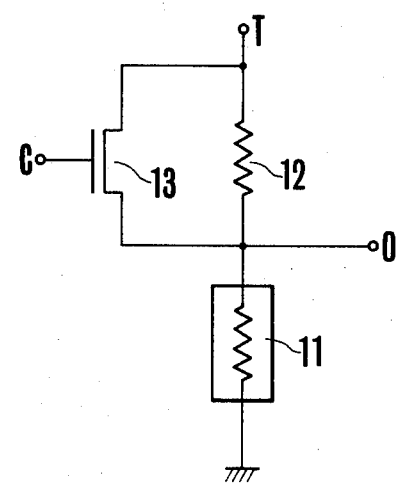

FIG. 8 shows still another variation of the control signal generating circuit in accordance with the present invention. This circuit configuration is identical with that shown in FIG. 1, except that both circuits have the opposite relationship with respect to the power connection. That is, in the circuit of FIG. 8, one end of variable resistance element 11 is grounded and the juncture of fixed resistor 12 and the drain terminal D of transistor 13 is connected to power supply terminal T. In this circuit configuration with variable resistance element 11 located at the grounded side, the control signal output terminal O has the opposite output mode relative to the circuit shown in FIG. 1.

The present invention is not limited to the aforementioned embodiments, but various modifications are possible. For example, a fixed resistor is employed for fixed impedance element 12, however, it does not need to be a fixed resistor, but it may behave non-linearity so far as the resistance can be chosen as mentioned above. In the above explanation, for purposes of simplicity, a large resistance ratio is chosen so that the two output modes are obtained at the voltage levels of $V_{DD}$ and 0 volt. However, it is obviously possible that the resistance ratio can be made smaller, while retaining the output voltage levels useful as a control signal. In the above embodiments, a field effect transistor is used for the active semiconductor device, however, it can be replaced with a bipolar transistor.

Also in the above embodiment, the control signal generating circuit in accordance with the present invention is combined with a random access memory, however, it can be combined with any integrated circuit with a different function. Moreover, in the embodiment of FIG. 4, the control signal generating circuit makes access to one spare circuit, however, it may be arranged to make access to a plurality of spare circuits.

What is claimed is:

1. An integrated circuit device comprising: a semiconductor integrated circuit chip including a plurality of circuit elements constituting a multi-functional circuit, and a control signal generating circuit incorporated within said semiconductor integrated circuit chip, said control signal generating circuit comprising: a variable resistance element whose resistance value irreversibly may be changed from a higher resistance value ($R_H$) to a lower resistance value ($R_L$); a fixed impedance element connected in series circuit with said variable resistance element, whose resistance value ($R_O$) is defined to satisfy a relation of $R_L<<R_O<<R_H$, the respective ends of said series circuit being connected to first and second reference voltage sources, respectively; a conductivity controlled active semiconductor device connected in parallel with said fixed impedance element, the conductive state of said conductivity controlled active semiconductor device being controlled by an external control signal; an output terminal connected to the juncture of said variable resistance element with said fixed impedance element, and to a selected part of said multi-functional circuit; and said variable resistance element being at the higher resistance value ($R_H$) under normal operating conditions and being switched to the lower resistance value ($R_L$) from the higher resistance value by impressing upon said variable resistance element a higher voltage than a threshold voltage value greater than a normal operating voltage value impressed thereon in a normal operating state so that said selected part of said multi-functional circuit may be rendered operable through said output terminal.

2. An integrated circuit device in accordance with claim 1, wherein said variable resistance element comprises a polycrystalline silicon resistor.

3. An integrated circuit device according to claim 1, wherein said variable resistance element comprises a PN junction.

4. An integrated circuit device in accordance with claim 1, wherein said conductivity controlled active semiconductor device is a transistor.

5. An integrated circuit device in accordance with claim 4, wherein the transistor has output electrodes and a control electrode, the output electrodes of said transistor are connected in parallel across said fixed impedance element, and means are provided for applying an external control signal to the control electrode of said transistor.

6. An integrated circuit device in accordance with claim 5, wherein the control electrode of said transistor is connected across a resistor connected between the control electrode and the output electrode thereof opposite the one connected to the juncture of the variable resistance element with the fixed impedance element.

7. An integrated circuit device in accordance with claim 1, wherein one end of said series circuit comprised of said variable resistance element and fixed impedance element is grounded.

8. An integrated circuit device in accordance with claim 7, wherein the end of said fixed impedance element opposite the one connected to said variable resistance element is grounded.

9. An integrated circuit device in accordance with claim 7, wherein the end of said variable resistance element opposite the one connected to said fixed impedance element is grounded.

10. An integrated circuit device in accordance with claim 1, wherein said semiconductor chip includes a plurality of bonding pads formed near the peripheral edges of said semiconductor chip, and wherein said device further comprises: a ceramic substrate on which said semiconductor chip is mounted; a plurality of leads disposed around said semiconductor chip on said ceramic substrate; and conductive wires characterized by connecting said pads on said semiconductor chip with said leads.

11. An integrated circuit device in accordance with claim 10, wherein one of said bonding pads provided on said semiconductor chip is used as a power supply terminal for said control signal generating circuit, and another one of said bonding pads is used as a write control terminal for said control signal generating circuit.

12. An integrated circuit device comprising: a semiconductor integrated circuit chip including a plurality of circuit elements constituting a multi-functional circuit, and a control signal generating circuit incorporated within said semiconductor integrated circuit chip, said control signal generating circuit comprising: a variable resistance element whose resistance value irreversibly may be changed from a higher resistance value ($R_H$) to a lower resistance value ($R_L$); a fixed impedance element connected in series circuit with said variable resistance element, whose resistance value ($R_O$) is defined to satisfy a relation of $R_L<<R_O<<R_H$, the respective ends of said series circuit being connected to first and second reference voltage sources, respectively; a conductivity controlled active semiconductor device connected in parallel with said fixed impedance element, the conductive state of said active semiconductor device being controlled by an external control signal; an output terminal connected to the juncture of said variable resistance element with said fixed impedance element and to a selected part of said multi-functional circuit; said variable resistance element being at the higher resistance value ($R_H$) under normal operating conditions and being switched to the lower resistance value ($R_L$) from the higher resistance value by impressing upon said variable resistance element a higher voltage than a threshold voltage value greater than a normal operating voltage value impressed thereon in a normal operating state so that said selected part of said multi-functional circuit may be rendered operable through said output terminal; said semiconductor chip further including a plurality of bonding pads formed near the peripheral edges of said semiconductor chip: and said device further comprising a ceramic substrate on which said semiconductor chip is mounted; a plurality of leads disposed around said semiconductor chip on said ceramic substrate; and conductive wires characterized by connecting said pads on said semiconductor chip with said leads; one of said bonding pads provided on said semiconductor chip being used as a power supply terminal for said control signal generating circuit and another one of said bonding pads being used as a write control signal terminal for said control signal generating circuit.

13. An integrated circuit device in accordance with claim 12, wherein the pads used as the power supply terminal and write control terminal of said control signal gnerating circuit are free from said leads.

14. An integrated circuit device in accordance with claim 12, wherein the pads used as the power supply terminal and write control terminal of said control signal generating circuit are connected to said leads.

* * * * *